United States Patent [19]

Robillard et al.

[11] 4,096,348

[45] Jun. 20, 1978

[54] INTEGRATED TEST AND ASSEMBLY DEVICE

[75] Inventors: David R. Robillard, Westboro; Robert L. Michals, Marlboro, both of Mass.

[73] Assignee: Raytheon Company, Lexington, Mass.

[21] Appl. No.: 666,826

[22] Filed: Mar. 15, 1976

Related U.S. Application Data

[62] Division of Ser. No. 583,739, Jun. 4, 1975, Pat. No. 3,984,620.

[51] Int. Cl.² .......................... H05K 5/02; H05K 1/02
[52] U.S. Cl. .............................. 174/52 FP; 228/110; 29/589
[58] Field of Search ............... 174/52 FP; 357/69; 339/17 R; 228/110; 29/589, 625

[56] References Cited

U.S. PATENT DOCUMENTS

| | | | |
|---|---|---|---|
| 3,436,604 | 4/1969 | Hyltin et al. ................... | 174/68.5 X |
| 3,480,836 | 11/1969 | Aronstein ..................... | 174/52 FP X |
| 3,484,534 | 12/1969 | Kilby et al. ................... | 174/52 FP X |
| 3,698,075 | 10/1972 | Boyle .............................. | 29/589 X |
| 3,709,424 | 1/1973 | Drees .............................. | 29/589 X |

Primary Examiner—Arthur T. Grimley
Assistant Examiner—D. A. Tone
Attorney, Agent, or Firm—J. R. Inge; M. D. Bartlett; J. D. Pannone

[57] ABSTRACT

A semiconductor integrated circuit device of the beam lead type having a semiconductor interconnection substrate with apertures for integrated circuit chips therein and with metallization patterns having sharply pointed ends for penetrating oxide layers over the bonding pads of the chips and for making electrical connection thereto. Devices thus produced may be assembled and tested and failed chips replaced as necessary before the chips are ultrasonically welded to the interconnection metallization and before final fabrication of the device. The invention also includes a method for producing an interconnection substrate in which a plurality of conically shaped holes are etched into a semiconductor wafer having sharp points within the body of the wafer. A metal layer is deposited over the surface of the semiconductor wafer filling the etched holes. Sharp points are thus formed on the metal in the etched holes. Apertures are then etched in the semiconductor wafer and the metal layer etched as required to provide sharply pointed connecting probes suspended above apertures in the semiconductor wafer.

10 Claims, 8 Drawing Figures

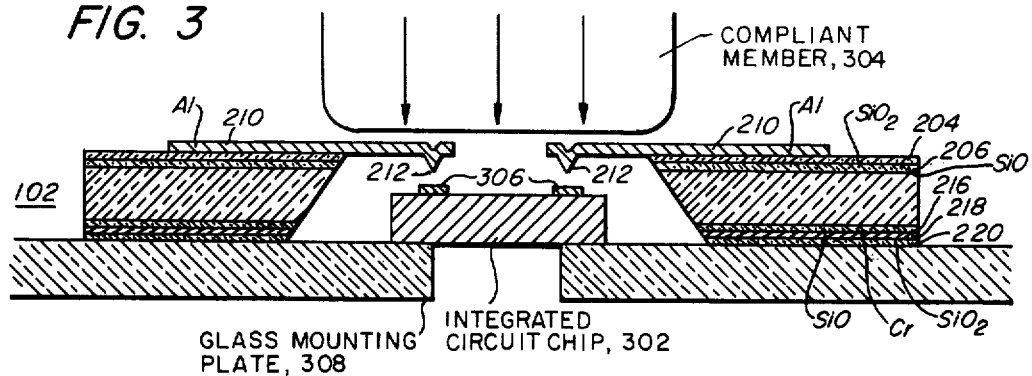
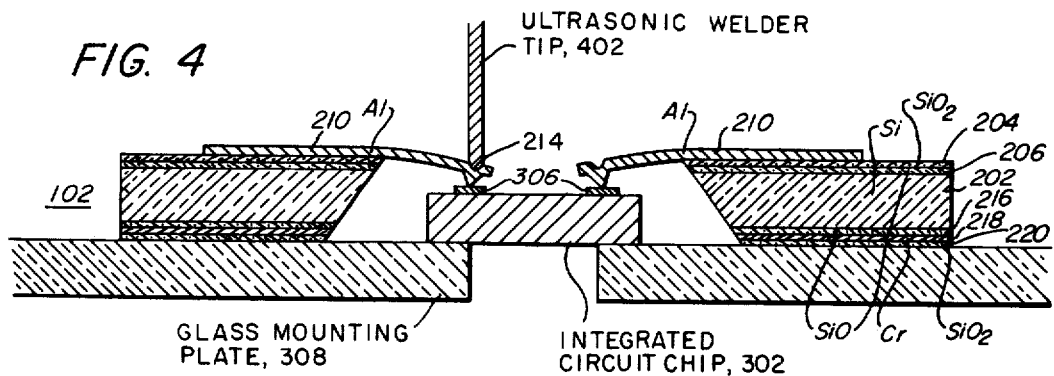

INTEGRATED TEST AND ASSEMBLY DEVICE

CROSS-REFERENCE TO RELATED CASES

This is a division of application Ser. No. 583,739, filed June 4, 1975, now U.S. Pat. No. 3,984,620.

BACKGROUND OF THE INVENTION

1. Field of the Invention

The invention relates to a method and means for testing integrated circuit chips of the beam lead type before final assembly of the complete semiconductor device. The invention also relates to a method for fabricating and interconnection substrate used in assembling integrated circuit chip devices into a complete package.

2. Description of the Prior Art

Before the invention there were three methods in general use employed for electrically testing integrated circuit devices.

In the first of these methods employing a probe and positioner, a blade or wire probe is mounted in a X-Y-Z positioner. A number of wafers each containing many integrated circuit chips as yet in unscribed form were mounted radially upon a probe ring. One integrated circuit device was tested at any one time by continually repositioning the probe.

In the second generally used method, involving a fixed point probe card, a wire or blade probe is permanently mounted to a printed circuit card which was specifically designed for the specific integrated circuit chip device being tested. Again, the method was usable in testing only one integrated circuit chip device at any one time.

In the third method involving a probe block, an insulating material is drilled to receive spring-loaded contact pins which coincide with the bonding pads or test points of the integrated circuit chip. This method proved to be generally inapplicable for testing large-scale integrated circuit devices because of the general inability to attain probe spacings of less than 0.004 inches center-to-center.

All of the above-described previously used methods have been capable of testing integrated circuit chip devices using only DC or static tests. That is, the devices could not be tested at the frequency, speed, or data rate at which they were designed to operate when they were later scribed and assembled in a complete integrated circuit device package. Dynamic or AC testing had to wait until the chip was assembled into the final package. If the assembled device failed one or more dynamic tests, the entire device had to be discarded. As packaging costs frequently are greater than the cost of a fabricarted integrated circuit chip, this procedure was quite wasteful.

SUMMARY OF THE INVENTION

Accordingly, it is an object of the present invention to provide a method and means for dynamically testing integrated circuit chips without having to assembly the chips in their final circuit configuration.

Also, it is an object of the present invention to provide an inexpensive integrated circuit package and interconnection substrate for use within such a package which may be fabricated inexpensively, preferably using well-developed integrated circuit techniques.

Moreover, it is an object of the present invention to provide such a package having both low processing costs and ease of assembly.

These as well as other objects of the invention are met by providing an integrated circuit device comprising the combination of a package frame having a first set of conductive leads extending through at least one insulative portion of the package, and an interconnection substrate within the package frame having a second set of conductive leads upon at least one surface thereof, wherein one end of each of the leads of the second set of leads is coupled to a lead of the first set of leads, wherein the interconnection substrate has one or more apertures therein adapted for receiving integrated circuit chips, and wherein a second end of each of the leads of the second set of leads is adapted for coupling to external connection means of the integrated circuit chips, the interconnection substrate comprising a substrate or wafer of semiconductor material of predetermined preferred thickness. The second ends of each of the second set of leads preferably include a substantially pointed tip for piercing the oxide coating over the bonding pads or external connection means of the integrated circuit chips. In the preferred embodiment, the second set of leads and external connection means each comprise aluminum. Also, the interconnection substrate and integrated circuit chip both comprise the same type of semiconductor material. That is, they are both silicon or both germanium although the interconnection substrate is preferably intrinsic material or material having as low a doping density as possible while the integrated circuit chip may have many different doping densities of any polarity type. The aforementioned package frame preferably comprises a ceramic base adapted for receiving the interconnection substrate, a ceramic spacer, and a lid for sealing the package. The second set of leads may be sputtered upon the interconnection substrate preferably including an insulating layer between the leads and the substrate.

Furthermore, the invention may be met by an interconnection device for use with an integrated circuit device for coupling an active integrated circuit chip to external lead means within a package frame comprising the combination of a substantially planar wafer of semiconductor material having one or more apertures which are adapted for receiving an integrated circuit chip, one or more insulating layers upon at least a portion of a surface of the wafer, and a plurality of conductive lead means disposed upon the insulating layers, one end of each of the lead means extending into the region of the apertures, that end being used for making connection to integrated circuit chips which are positioned in the aperture, those end having a substantially pointed tip for making contact with the bonding pads or external connections of the integrated circuit chips. In the preferred embodiment, the lead means comprises aluminum. The conductive lead means may comprise a plurality of groups of conductive means each of the groups being electrically insulated from one another and wherein each of the groups may be located at a separate level above the surface of the wafer. The leads may comprise sputtered aluminum and the wafer silicon. For fabrication of the pointed tips, the silicon preferably has substantially a (100) crystallographic orientation relative to the surface upon which etching is performed. A depression is preferably located in the metal of the conductive lead means substantially opposite the pointed tip.

The invention may also be practiced by a method comprising the steps of providing a substantially planar wafer of substantially (100) oriented silicon, etching the wafer in a plurality of substantially circular areas to provide etched regions in at least one surface of the wafer, the etched regions having a point at the innermost portions thereof within the wafer, depositing one or more layers of metal over at least portions of the surface of the wafer, the metal filling at least the inner portions of the etched regions to thereby form pointed tips therein and etching away portions of the wafer surrounding and under the pointed tips to thereby leave one or more apertures in the wafer under the pointed tips. The step of etching the wafer in a plurality of substantially circular areas may comprise the steps of depositing a layer of oxide upon the surface of the wafer, removing the oxide in predetermined regions and applying a selective etchant to the semiconductor material exposed thereby in the predetermined regions. The predetermined regions are preferably substantially circular. The method may further comprise the step of etching portions of the layers of metal to provide predetermined conductor patterns. All the metal used for the conductor patterns is preferably aluminum.

The invention may also be practiced by a method comprising the steps of providing an interconnection substrate which comprises in combination a wafer of semiconductor material, the wafer having one or more apertures therein in which at least some of the apertures are adapted for receiving an integrated circuit chip (as other of the apertures may be adapted for receiving passive circuitry), and a plurality of conductive leads upon at least one surface of the wafer, ends of at least some of the conductive leads extending over the apertures and wherein the conductive leads have a pointed tip at their ends facing the apertures and a depression opposite the pointed tips, and wherein the conductive leads are substantially insulated from the wafer. The method further comprises the steps of providing one or more integrated circuit chips each of which has a plurality of conductive bonding pads, positioning the chips in the apertures by aligning the pointed tips with the bonding pads, and applying pressure to the ends of the leads to cause the pointed tips to make electrical contact with the bonding pads. Additionally a step may be performed of testing the assembled interconnection substrate including the integrated circuit chips. After the initial testing is completed, integrated circuit chips which failed the testing are replaced. The testing may be repeated and integrated circuit chips replaced until the device as assembled at that point passes all dynamic testing. Thereafter the pointed tips may be welded to the bonding pads. The welding preferably comprises the steps of coupling an ultrasonic welding probe to the depressions in the ends of the conductive leads and applying sufficient ultrasonic energy to cause a welded bond to be formed between the pointed tips and the bending pads of the integrated circuit chips. The final device may then be assembled by assembling the interconnecting substrate including the integrated circuit chips which were previously welded to the conductive leads thereto in a package frame and coupling at least some of the leads of the interconnecting substrate to external connection providing means upon the package frame.

BRIEF DESCRIPTION OF THE DRAWINGS

FIG. 3 illustrates the testing of an integrated circuit device prior to final assembly;

FIG. 4 shows the welding of the interconnection substrate metallization leads to the bonding pads of an integrated circuit chip in accordance with the invention.

DESCRIPTION OF THE PREFERRED EMBODIMENTS

Figure 1:
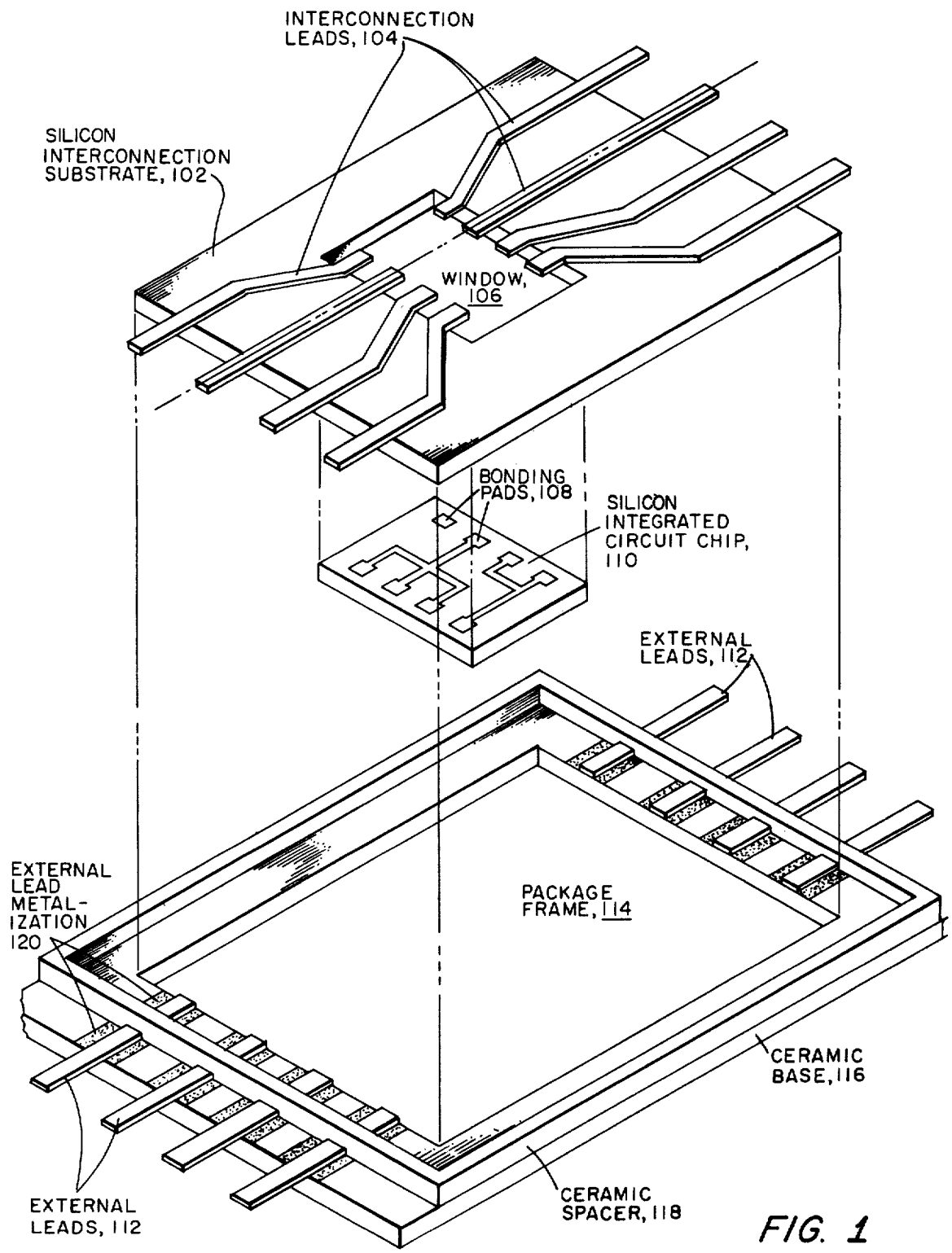
FIG. 1 shows an exploded and perspective view of an integrated circuit device which is constructed in accordance with the teachings of the invention.

Referring first to FIG. 1 there is shown a perspective and exploded view of an integrated circuit device in which the present invention is used to advantage. The entire device is assembled within package frame 114. Package frame 114 includes a ceramic base 116 which is a substantially planar member with a partially hollowed region in the center adapted for the positioning therein of interconnection substrate 102.

At two ends of ceramic base 116 are located a series of external lead metallization layers 120 which are used for bringing connections from the integrated circuit chip and interconnection substrate 102 to the exterior of the package. Each of external lead metallization layers 120 is preferably a thin layer of highly conductive metal such as gold around which a hermetic seal can easily be made and maintained. External leads 112 are electrically and mechanically coupled to external lead metallization layers 120 on the outer edge of ceramic base 116. Ceramic spacer 118 is hermetically sealed stop ceramic base 116 including external lead metallization layers 120. Ceramic spacer 118 is of sufficient height to clear the upper portion of interconnection substrate 102 and integrated circuit chip 110 when the package is fully assembled. A lid, which is not shown and which is preferably of metal, completes the hermetically sealed package.

Interconnection substrate 102 provides a means for connecting the bonding pads 108 of integrated circuit chip 110 to external lead metallization layers 120 upon package frame 114. Integrated circuit chip 110 is mounted within the aperture of window 106. The ends of interconnection leads 104 which extend over the aperture of window 106 are aligned with and welded to the appropriate ones of bonding pads 108 of integrated circuit chip 110. The other ends of interconnection leads 104 are coupled electrically to the portion of external lead metallization layers 120 inside of ceramic spacer 118.

In the past it was necessary to assemble all the components shown in the integrated circuit device of FIG. 1 before the device could be dynamically tested, that is, the device tested at the frequency at which it was intended to operate once assembled. If by chance the integrated circuit chip was nonfunctioning, the entire device including the package, interconnection substrate, and integrated circuit chip had to be discarded. It has long been sought to provide a method and means for testing such integrated circuit chips prior to final assembly. Such has been achieved with the use of interconnection substrate in accordance with the invention, and the methods for constructing the substrate, and for assembling and testing the integrated circuit chips.

Referring now to the series of cross-sectional views shown in FIGS. 2A-D there will be described the fabrication of interconnection substrate 102 in accordance with the invention. Assembly is commenced with a wafer 202 of semiconductor material. For the preferred embodiment, wafer 202 is intrinsic or at most lightly doped silicon with a preferred thickness of 10 mils. Atop wafer 202 is grown a layer of thermal oxide (SiO) 206 having a preferred thickness in the range of 30,000-45,000A and atop thermal oxide 206 a layer of quartz ($SiO_2$). Using standard photolithographic techniques, circular holes 207 are etched through quartz layer 204 and thermal oxide layer 206. In the preferred embodiment these holes have a diameter of 2 mils.

Silicon wafer 202 has a preferred (100) crystallographic orientation relative to its two broad surfaces. After holes 207 have been etched through the thermal oxide and quartz layers, holes 207 are flooded with an etchant solution which attacks silicon wafer 202 only along preferred axes. Holes 208 are thusly etched each of which is in the shape of a four-sided polyhedron pointed downwards. Each side of the polyhedron is at an angle of approximately 54° with respect to the vertical axis.

Over the surface of quartz layer 204 is then deposited a layer of aluminum. Sputtering may be used as the preferred method of deposition. The sputtered aluminum fills holes 208 and extends over the surface of quartz layer 204. It should be noted that sharp points 212 are formed at the innermost portion of holes 208 and that small depressions 214 are formed on the oppposite side of the metal layer from points 212.

The sputter deposited aluminum layer is then preferentially etched to form a desired metal interconnection pattern atop quartz layer 204. Layers of thermal oxide 216, chromium 218, and quartz 220 are then deposited over the lower surface of semiconductor wafer 202. A hole is then etched through layers 216, 218 and 220 having dimensions slightly larger than the linear dimensions of the integrated circuit chip to be tested and mounted. Layers 216, 218, and 220 may be removed if desired before bonding to a package base. Next, as shown in the view of FIG. 2D, semiconductor wafer 202 is preferentially etched as was the smaller holes on the upper surface to expose end portions of interconnection leads 210 including sharp points 212.

Figure 2A:
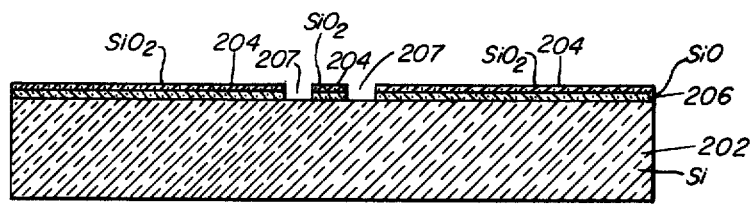
FIGS. 2A–D are cross-sectional views and illustrate various steps in the fabrication of an interconnection substrate in accordance with the invention.
Figure 2B:
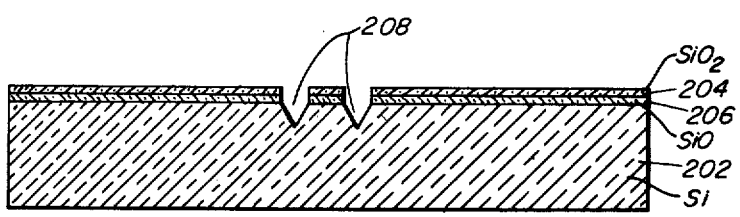
Figure 2C:
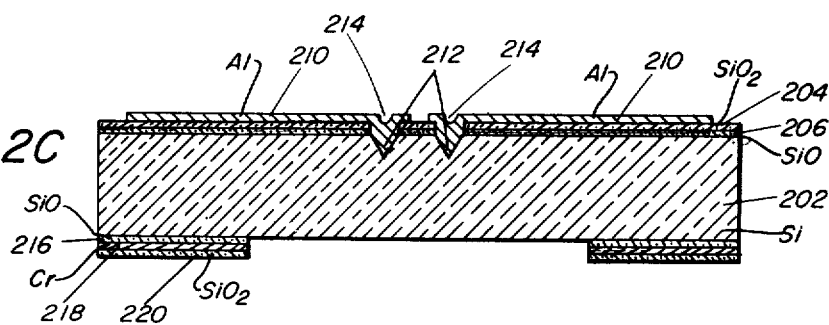
Figure 2D:
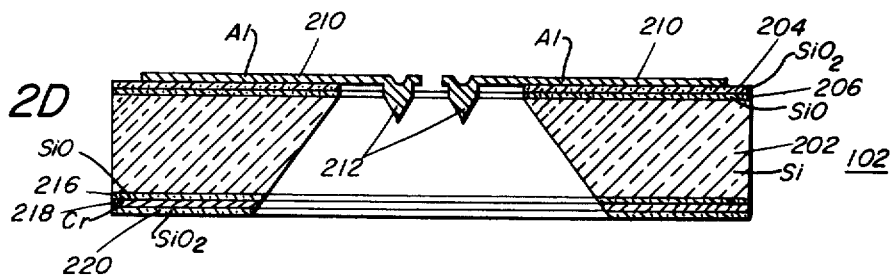

Interconnection substrate 102 as shown in FIG. 2D is then ready for the testing and mounting of integrated circuit chips. For clarity of illustration, only two leads 210, two sharp points 212, and a single integrated circuit mounting hole have been shown. Of course, any number of leads may be used and any number of integrated circuit mounting holes provided in a single semiconductor wafer.

Figure 5:
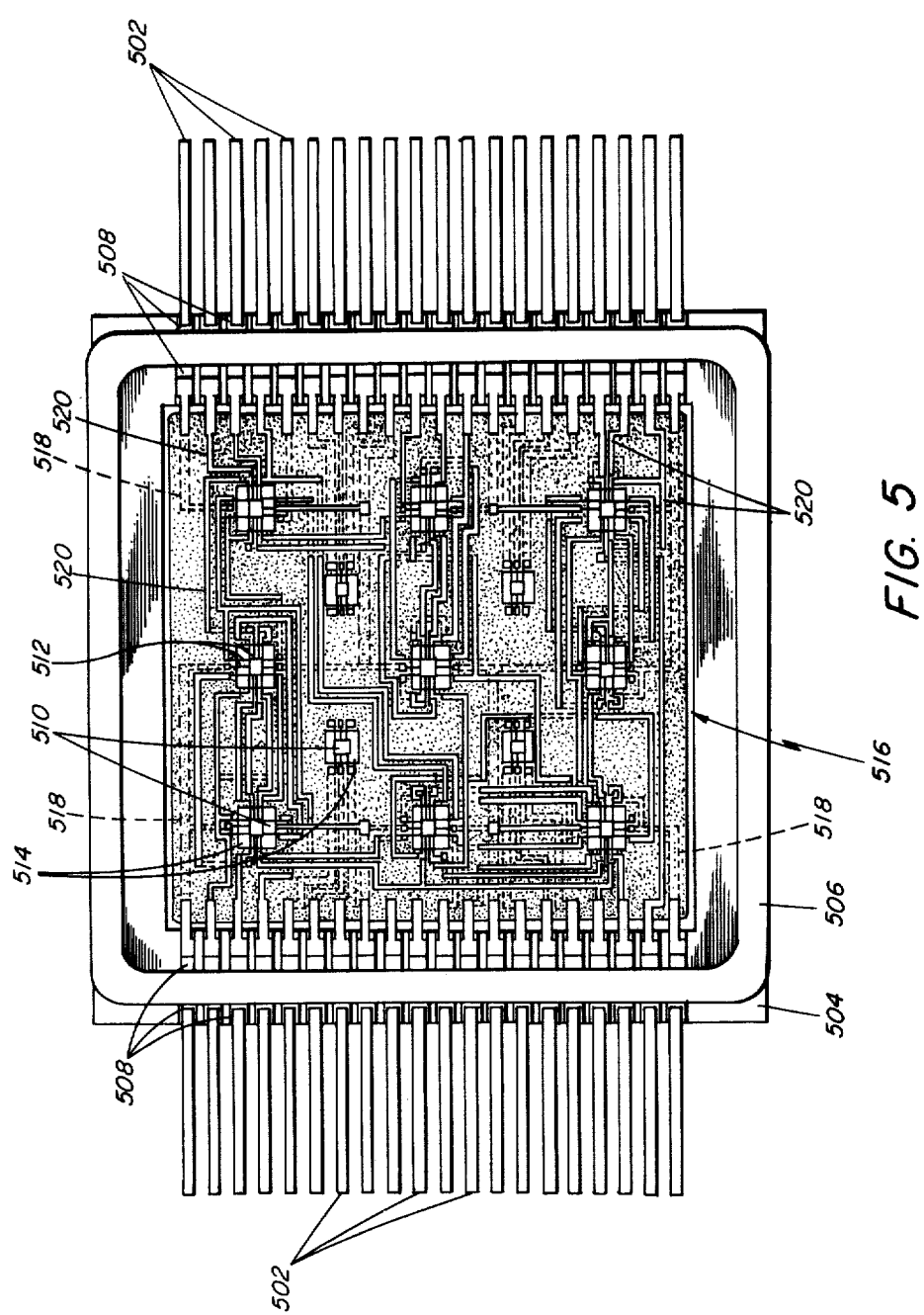
FIG. 5 shows a planar view of an assembled semiconductor device in accordance with the invention employing a plurality of semiconductor chips.

To test integrated circuit chip 302, chip 302 is first set upon glass mounting plate 308 and by any convenient means caused to adhere thereto. In the preferred embodiment, a vacuum is provided on the underside of integrated chip 302 through a hole in glass mounting plate 308, normal atmospheric pressure is permitted to exist above the upper surface of glass mounting plate 308. Interconnection substrate 102 is then positioned over integrated circuit chip 302 upon glass plate 308. Sharp points 212 of interconnection leads 210 are positioned above the appropriate ones of bonding pads 306 of integrated circuit chip 302. Preferably, bonding pads 306 are constructed of aluminum. When pressure is exerted by compliant member 304 upon the ends of leads 210, sharp points 212 are forced against bonding pads 306, breaking the aluminum oxide coating which forms in air upon the aluminum surface, and making electrical connection thereto. At this point of assembly, integrated circuit chip 302 and interconnection substrate 102 may be tested dynamically by application of appropriate signals to leads 210. An improperly functioning integrated circuit chip 302 may be discarded before assembly proceeds any further, thus obviating the necessity for first assembling the entire device before proceeding with the testing. Preferably, and as is shown in FIG. 5, a number of integrated circuit chips 302 may be thusly assembled for tests with a single interconnection substrate. In that manner, the entire circuit device may be tested as a unit.

Once it has been determined that an integrated circuit chip 302 is properly functioning, leads 210 through sharp points 212 are welded to bonding pads 306. Welding ultrasonically may be easily accomplished with the present invention. Tip 402 of an ultrasonic welder unit is fitted into depression 214 at the end of leads 210. Depression 214 holds tip 402 in place during the welding operation and additionally provides a self-aligning function as tip 402 is advanced towards the ends of leads 210. After sharp points 212 have been pushed into place by ultrasonic welder tip 402, ultrasonic energy is applied through tip 402 causing a rise in temperature sufficient to cause melting and bonding of metal between sharp points 212 and bonding pads 306.

Two additional advantages in using sharp points 212 at ends of leads 210 in accordance with the invention are to be noted. First, in prior art devices using no sharp nodes or tips, and with integrated circuit chips using a passivation layer everywhere except above the bonding pads, the leads often broke through the passivation layer. Secondly, sharp points 212 provide means for concentrating the ultrasonic energy from ultrasonic welder tip 402 in a smaller area thus reducing the total amount of ultrasonic energy required to achieve welding and thus reducing the chance of damage to the integrated circuit chip caused by the presence of ultrasonic energy. It has been found that with the present invention only one-fourth to one-fifth of the ultrasonic energy previously is required to achieve a good welded joint.

An assembled integrated circuit device with the lid removed is shown in the planar view of FIG. 5. Interconnection substrate 516 is positioned in the partially hollowed portion of ceramic base 504. External leads 502, external lead metallization 508, and ceramic spacer 506 perform the same functions as the similarly named components of FIG. 1. However, in the device shown in FIG. 5, interconnection substrate 516 includes a plurality of apertures 514 each containing an integrated circuit chip device 510. Integrated circuit chip devices 510 can each be the same type of device or some may differ from one another. Passive devices may be used as well. Two levels of interconnection leads are used to interconnect integrated circuit chip devices 510 and with external lead metallization 508. The first level of interconnection leads 518, shown in dotted lines, lies atop a first insulating layer upon the surface of interconnection substrate 516. A second insulating layer separates the second level of interconnection leads 520, shown in solid lines. Connections to integrated circuit chip devices 510 are made in the manner of the invention. In constructing the device shown in FIG. 5, integrated circuit chip devices 510 may be assembled with interconnection substrate 516 and tested in the manner previously described prior to lead welding and final assembly.

Although preferred embodiments of the invention have been described, numerous modifications and alterations thereto would be apparent to one having ordinary skill in the art without departing from the spirit and scope of the invention.

What is claimed is:

1. An interconnection device for use with an integrated circuit device for coupling an active integrated circuit chip to external lead means within a package frame comprising in combination:
   a substantially planar wafer of semiconductor material, said wafer having one or more apertures therein, at least some of said apertures being adapted for receiving an integrated circuit chip;
   one or more insulating layers upon at least a portion of a surface of said wafer; and
   a plurality of conductive lead means disposed upon said insulating layers, one end of each of said lead means extending into the region of said apertures for making connection to said integrated circuit chips, said ends having a substantially pointed tip thereon projecting into said apertures in a direction substantially normal to said surface of said wafer.

2. The combination of claim 1 wherein said lead means comprise aluminum.

3. The combination of claim 1 wherein said conductive lead means comprise a plurality of groups of conductive lead means, each of said groups being electrically insulated from each other.

4. The combination of claim 3 wherein each of said groups is located upon a separate level.

5. The combination of claim 1 wherein leads comprise sputtered aluminum.

6. The combination of claim 1 wherein said wafer comprises silicon.

7. The combination of claim 6 wherein said silicon has substantially a (100) orientation.

8. The combination of claim 1 wherein a depression is located upon said end of said conductive lead means substantially opposite said pointed tip.

9. An interconnection device for use with an integrated circuit device for coupling an active integrated circuit chip to external lead means within a package frame comprising in combination:
   a substantially planar wafer of silicon semiconductor material having a substantially (100) orientation, said wafer having one or more apertures therein, at least some of said apertures being adapted for receiving an integrated circuit chip;
   one or more insulating layers upon at least a portion of a surface of said wafer; and
   a plurality of conductive lead means disposed upon said insulating layers, one end of each of said lead means extending into the region of said apertures for making connection to said integrated circuit chips, said ends having a substantially pointed tip thereon.

10. An interconnection device for use with an integrated circuit device for coupling an active integrated circuit chip to external lead means within a package frame comprising in combination:
    a substantially planar wafer of semiconductor material, said wafer having one or more apertures therein, at least some of said apertures being adapted for receiving an integrated circuit chip;
    one or more insulating layers upon at least a portion of a surface of said wafer; and
    a plurality of conductive lead means disposed upon said insulating layers, one end of each of said lead means extending into the region of said apertures for making connection to said integrated circuit chips, said ends having a substantially pointed tip thereon and having a depression on the side of said conductive lead opposite said pointed tip.

* * * * *